US012068180B2

United States Patent
Lu et al.

(10) Patent No.: US 12,068,180 B2
(45) Date of Patent: Aug. 20, 2024

(54) ADVANCED TEMPERATURE MONITORING SYSTEM AND METHODS FOR SEMICONDUCTOR MANUFACTURE PRODUCTIVITY

(71) Applicant: Applied Materials, Inc., Santa Clara, CA (US)

(72) Inventors: Xuesong Lu, Santa Clara, CA (US); Lin Zhang, San Jose, CA (US); Joseph C. Werner, Santa Clara, CA (US); Jang Seok Oh, San Ramon, CA (US); Balaji Pasupathy, Chennai (IN); Michael W. Johnson, Austin, TX (US)

(73) Assignee: Applied Materials, Inc., Santa Clara, CA (US)

( * ) Notice: Subject to any disclaimer, the term of this patent is extended or adjusted under 35 U.S.C. 154(b) by 1152 days.

(21) Appl. No.: 16/247,026

(22) Filed: Jan. 14, 2019

(65) Prior Publication Data

US 2019/0221458 A1    Jul. 18, 2019

(30) Foreign Application Priority Data

Jan. 15, 2018   (IN) .............................. 201841001599

(51) Int. Cl.
*H01L 21/67*         (2006.01)
*C23C 16/455*        (2006.01)
(Continued)

(52) U.S. Cl.
CPC ...... *H01L 21/67248* (2013.01); *C23C 16/455* (2013.01); *C23C 16/45544* (2013.01);
(Continued)

(58) Field of Classification Search
CPC . C23C 16/455; C23C 16/45544; C23C 16/50; C23C 16/52; C23C 16/4586;
(Continued)

(56) References Cited

U.S. PATENT DOCUMENTS

| 6,210,485 B1 | 4/2001 | Zhao et al. |
| 6,527,865 B1 | 3/2003 | Sajoto et al. |

(Continued)

FOREIGN PATENT DOCUMENTS

| CN | 103245848 A | 8/2013 |
| JP | 2005085935 A | 3/2005 |

(Continued)

OTHER PUBLICATIONS

MKS Instruments, Inc.—"Controlling Vapor Condensation and Downstream Deposits in Deposition and Etch Tools" Application Note, Jun.-Dec. 2016, 8 pages.

(Continued)

*Primary Examiner* — Christopher W Carter
(74) *Attorney, Agent, or Firm* — Patterson + Sheridan, LLP

(57) ABSTRACT

Embodiments herein provide methods of monitoring temperatures of fluid delivery conduits for delivering fluids to, and other components external to, a processing volume of a processing chamber used in electronic device fabrication manufacturing, and monitoring systems related thereto. In one embodiment, a method of monitoring a processing system includes receiving, through a data acquisition device, temperature information from one or more temperature sensors and receiving context information from a system controller coupled to a processing system comprising the processing chamber. Here, the one or more temperature sensors are disposed in one or more locations external to a processing volume of a processing chamber. The context information relates to instructions executed by the system controller to control one or more operations of the processing system.

11 Claims, 5 Drawing Sheets

(51) Int. Cl.

| | |
|---|---|
| *C23C 16/50* | (2006.01) |
| *C23C 16/52* | (2006.01) |
| *G01K 3/00* | (2006.01) |
| *G01K 3/04* | (2006.01) |
| *G01K 3/10* | (2006.01) |
| *G05B 11/00* | (2006.01) |
| *G05B 13/02* | (2006.01) |
| *G05B 15/00* | (2006.01) |
| *G05B 15/02* | (2006.01) |
| *H01J 37/32* | (2006.01) |
| *H01L 21/02* | (2006.01) |
| *H01L 21/687* | (2006.01) |

(52) U.S. Cl.
CPC .............. *C23C 16/50* (2013.01); *C23C 16/52* (2013.01); *G01K 3/005* (2013.01); *G01K 3/04* (2013.01); *G01K 3/10* (2013.01); *G05B 11/00* (2013.01); *G05B 13/02* (2013.01); *G05B 15/00* (2013.01); *G05B 15/02* (2013.01); *H01J 37/3244* (2013.01); *H01J 37/32899* (2013.01); *H01L 21/02* (2013.01); *H01L 21/02312* (2013.01); *H01L 21/67* (2013.01); *H01L 21/67017* (2013.01); *H01L 21/67103* (2013.01); *H01L 21/67109* (2013.01); *H01L 21/67167* (2013.01); *H01L 21/67207* (2013.01); *H01L 21/67253* (2013.01); *H01L 21/68742* (2013.01); *H01J 2237/24585* (2013.01); *H01J 2237/3321* (2013.01)

(58) Field of Classification Search
CPC ......... C23C 16/46; G05B 11/00; G05B 13/02; G05B 15/00; G05B 15/02; G01K 3/005; G01K 3/04; G01K 3/10; H01L 21/02; H01L 21/02312; H01L 21/67; H01L 21/67017; H01L 21/67103; H01L 21/67109; H01L 21/67167; H01L 21/67207; H01L 21/67253; H01L 21/68742; H01L 21/67276; H01L 22/12; H01L 22/30; H01J 2237/24585; H01J 2237/3321; H01J 2237/006; H01J 2237/30455; H01J 2237/31701; H01J 37/304

See application file for complete search history.

(56) References Cited

U.S. PATENT DOCUMENTS

| | | | |
|---|---|---|---|
| 6,635,114 B2 | 10/2003 | Zhao et al. | |
| 2002/0076492 A1* | 6/2002 | Loan ................... | F16K 31/1262 427/255.28 |
| 2005/0098906 A1 | 5/2005 | Satoh et al. | |
| 2005/0217794 A1* | 10/2005 | Kagoshima ....... | H01J 37/32935 156/345.24 |
| 2006/0142888 A1* | 6/2006 | Tanaka ............. | G05B 19/41875 700/110 |
| 2006/0151461 A1* | 7/2006 | Sandhu ............... | C23C 16/4486 219/388 |
| 2011/0171383 A1* | 7/2011 | Woelk .................... | B01B 1/005 29/890.07 |
| 2013/0019960 A1* | 1/2013 | Choi .................. | C23C 16/4408 137/627 |
| 2013/0025536 A1* | 1/2013 | Kruger .................... | C23C 16/54 427/255.28 |
| 2013/0025786 A1 | 1/2013 | Davidkovich et al. | |
| 2017/0213750 A1* | 7/2017 | Khaja ............... | H01L 21/67389 |

FOREIGN PATENT DOCUMENTS

| | | |
|---|---|---|
| KR | 20080055789 A | 6/2008 |
| KR | 20130023025 A | 3/2013 |
| KR | 101283571 B1 | 7/2013 |
| KR | 101285866 B1 | 7/2013 |
| KR | 20140118912 A | 10/2014 |
| TW | 200735164 A | 9/2007 |
| TW | 201230229 A | 7/2012 |
| TW | 201620073 A | 6/2016 |
| TW | 201624518 A | 7/2016 |
| TW | 201712781 A | 4/2017 |
| TW | 201718920 A | 6/2017 |
| TW | 201724263 A | 7/2017 |
| TW | 201729338 A | 8/2017 |
| WO | 2004070802 A1 | 8/2004 |
| WO | 2017056244 A1 | 4/2017 |

OTHER PUBLICATIONS

PCT International Search Report and Written Opinion dated May 10, 2019, for International Application No. PCT/US2019/013209.
Office Action for Taiwan Application No. 109142572 dated Jul. 29, 2021.
Search Report for Taiwan Application No. 109142572 dated Jul. 27, 2021.
Office Action for Korean Application No. 10-2020-7023218 dated Nov. 26, 2021.
Taiwan Office Action dated Feb. 25, 2020, for Taiwan Patent Application No. 108101482.
Korean Office Action issued to Application No. 10-2020-7023218 on May 12, 2022.
Chinese Office Action for Application No. 201980013792.7 dated Jan. 12, 2024.

* cited by examiner

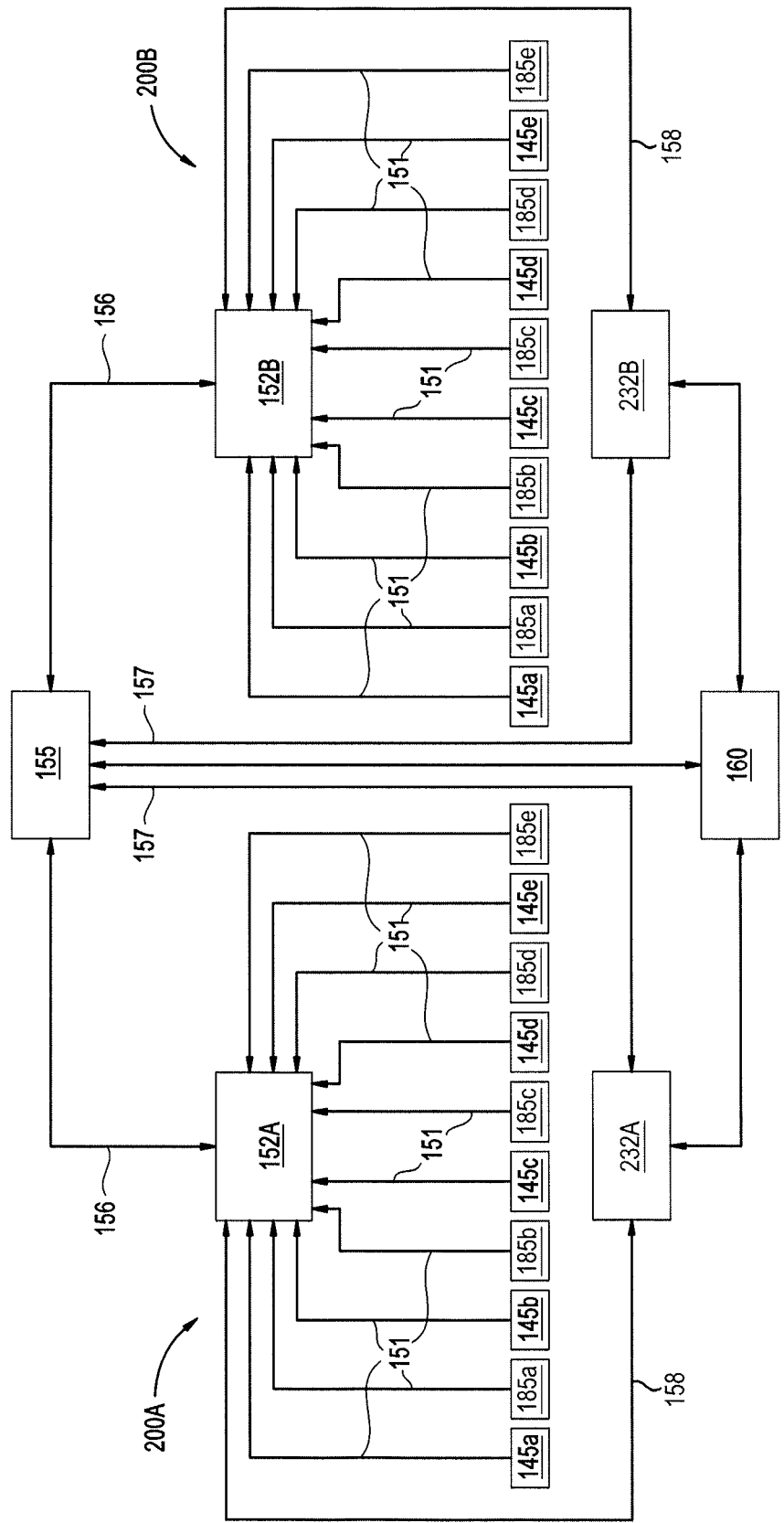

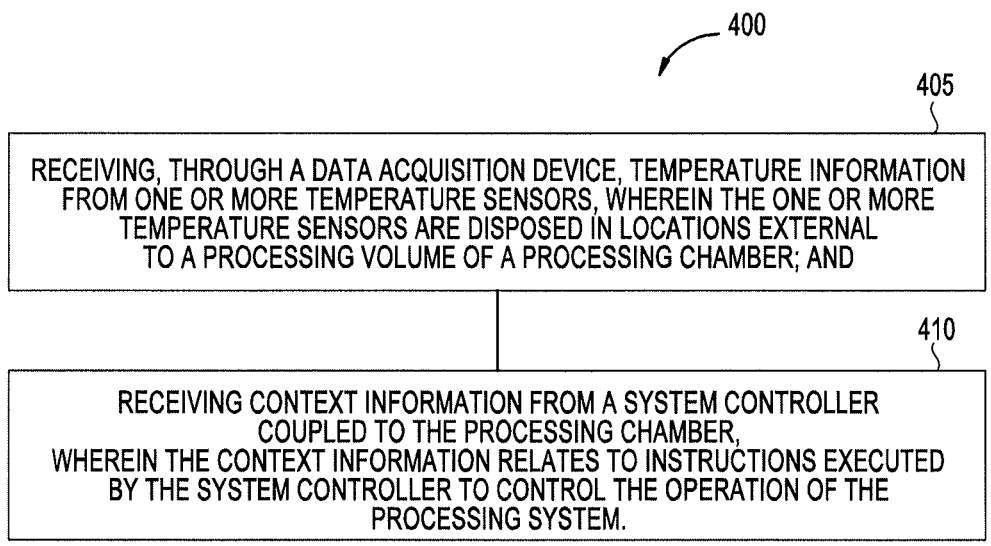

ADVANCED TEMPERATURE MONITORING SYSTEM AND METHODS FOR SEMICONDUCTOR MANUFACTURE PRODUCTIVITY

CROSS-REFERENCE TO RELATED APPLICATIONS

This application claims benefit of Indian Provisional Application Serial No. 201841001599, filed on Jan. 15, 2018, which is herein incorporated by reference in its entirety.

BACKGROUND

Field

Embodiments described herein generally relate to the field of semiconductor device manufacturing, and more particularly, to methods of monitoring components external to a processing volume of a processing chamber used in electronic device manufacturing, and monitoring systems related thereto.

Description of the Related Art

As circuit densities increase for next generation devices and transistor dimensions continue to shrink, clean, contamination free substrate processing environments become increasingly important. This is because undesirable particle contaminants on a surface of a substrate before, during, and, or, after processing thereof, can adversely affect device performance and, or, suppress device yield (the percentage of devices that conform to performance specifications out of a total number of devices manufactured). One known source of particle contamination results from condensation of vapor-phase precursors in fluid delivery conduits between a vapor-phase precursor source and a processing volume of a processing chamber.

Vapor-phase delivery systems, also known as vaporized liquid delivery systems, are commonly used in deposition processes, such as chemical vapor deposition (CVD) processes, atomic layer deposition (ALD) processes, or etch processes, where vapor-phase and sometimes gas precursors are reacted with, and, or, on, the surface of a substrate to deposit a material layer thereon or to remove a portion of a material layer therefrom. Vapor-phase delivery systems provide gas flow control and delivery of precursors that are otherwise in a liquid-phase or a solid-phase at ambient temperature and below and at atmospheric pressure and above.

Vapor-phase delivery systems commonly use an evaporation source, such as a heating vessel, to transition the precursor from a liquid-phase or a solid-phase to a vapor-phase. Typically, during the processing of a substrate, the vapor-phase precursor flows into a processing volume of a processing chamber, such as a CVD processing chamber, an ALD processing chamber, or an etch processing chamber, through a delivery conduit, and a surface of the substrate is exposed thereto. Often, the delivery conduit is heated, such as with a flexible polymer heater jacket comprising a resistive heating element or with heater tape wrapped around the delivery conduit and an insulating cover disposed thereover. Heating the delivery conduit along the length thereof prevents condensation of the vapor-phase precursor therein. Nonetheless, non-uniform temperatures along the walls of the delivery conduit, such as cold spots, can result in undesirable condensation and, or, deposition of the precursor on the inner surfaces thereof.

Unfortunately, undesirable condensation or deposition of the precursor in the delivery conduit leads to undesirable particle contamination in the processing volume and on the surface of the substrate disposed therein. Further, because flowrates of the vapor-phase precursors into the processing volume are often dependent on the temperature of both the evaporation source and the delivery conduit, non-uniform temperatures can undesirably impact the flowrate of the vapor-phase precursor. Changes in the flowrate of the vapor-phase precursor may affect the deposition rate and the material properties of the material layer deposited on the surface of the substrate.

Non-uniform temperatures along the delivery conduit can be the result of improper installation of a heater jacket, failure of the heating elements in the heating jacket, or failure of portions of heating elements. Non-uniform temperatures can also be the result of undesirable repositioning of the heating jacket during maintenance of the processing system, during maintenance of systems thereby, during facilities maintenance, or due to unintentional contact therewith. Often, non-uniform temperatures along the delivery conduit are not discovered until after resulting condensations in the delivery line causes a process excursion, such as a defectivity excursion, where particle contamination is found on the surface of a substrate after processing thereof or when suppressed device yield is traced back to the processing chamber through a commonality of substrates (having suppressed device yield) processed therethrough.

Further, conventional substrate processing systems are typically configured to monitor temperature measurements related to the substrate processing environment in the processing volume thereof. Generally, these processing systems lack the capability and flexibility to monitor temperature information related to processing components external to the substrate processing environment. High substrate processing temperatures, e.g., more than about 650° C., in the processing volume may adversely impact the performance and reliability of processing system components external to the processing volume but in thermal communication therewith.

Accordingly, what is needed in the art are methods of monitoring temperatures of delivery conduits to, and other components that are external to, a processing volume of a processing chamber used in electronic device fabrication manufacturing, and monitoring systems related thereto.

SUMMARY

Embodiments of the disclosure generally relate to substrate processing systems used in electronic device fabrication processes. More specifically, embodiments herein relate to methods of monitoring temperatures of delivery conduits to, and other components external to, a processing volume of a processing chamber used in electronic device fabrication manufacturing, and monitoring systems related thereto.

In one embodiment, which may be combined with one or more other embodiments disclosed herein, a method of monitoring a processing system includes receiving, through a data acquisition device, temperature information from one or more temperature sensors and receiving context information from a system controller coupled to a processing system, the processing system comprising the processing chamber. Here, the one or more temperature sensors are disposed in one or more locations external to a processing volume of the processing chamber. The context information relates to instructions executed by the system controller to control one or more operations of the processing system.

In another embodiment, which may be combined with one or more other embodiments disclosed herein, a method of monitoring a vapor-phase precursor delivery conduit includes receiving, through a data acquisition device, temperature information from a plurality of temperature sensors and receiving context information, from a system controller coupled to a processing system. The processing system comprises a processing chamber and a vapor-phase precursor source. The vapor-phase precursor source is fluidly coupled to a processing volume of the processing chamber by a vapor-phase delivery conduit. The plurality of temperature sensors are positioned at a respective plurality of locations along at least a portion of a length of the vapor-phase precursor delivery conduit. The context information relates to instructions executed by the system controller to control the operation of the processing system.

In another embodiment, which may be combined with one or more other embodiments disclosed herein, a temperature monitoring system includes a data acquisition device configured to receive information from one or more temperature sensors through one or more respective communication links and a remote monitor to be communicatively coupled to the data acquisition device and to a system controller of a processing system. The processing system comprises a processing chamber, and the one or more temperature sensors are respectively positioned at one or more locations external to a processing volume of the processing chamber.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 2B is a schematic representation of a remote monitoring system, adapted for use with a plurality of multi-chamber processing systems, according to one embodiment.

FIG. 4 is a flow diagram setting forth a method of monitoring a processing system, according to one embodiment.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the disclosure generally relate to substrate processing systems used in electronic device fabrication processes. More specifically, embodiments herein relate to methods of monitoring temperatures of fluid delivery conduits to, and other components external to, a processing volume of a processing chamber used in electronic device fabrication manufacturing, and monitoring systems related thereto.

Figure 1:
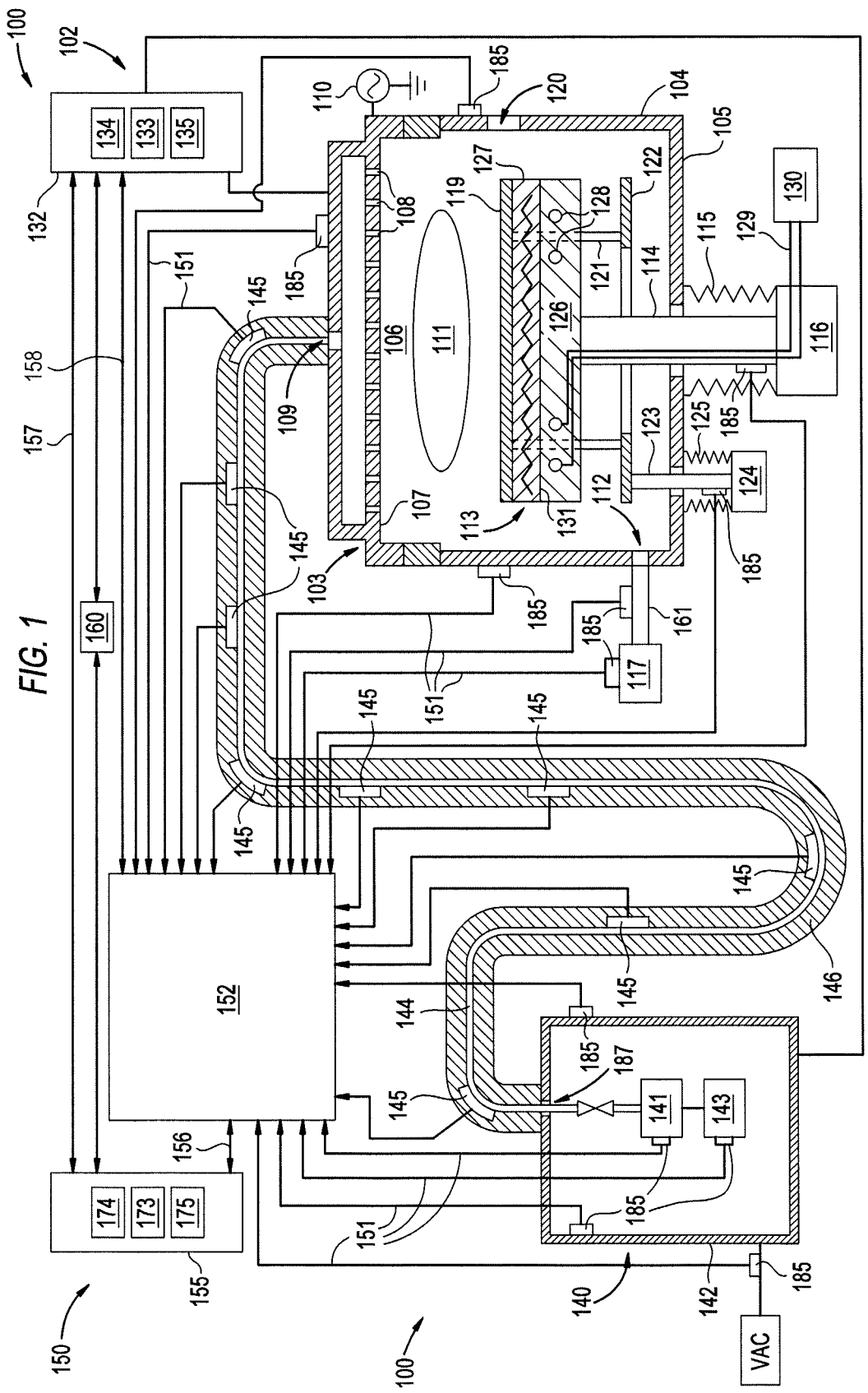
FIG. 1 is a schematic sectional view of a single chamber processing system and a schematic representation of a remote monitoring system used therewith, according to one embodiment.

FIG. 1 is a schematic sectional view of a processing system and schematic representation of a remote monitoring system used therewith, according to one embodiment. The processing system 100 includes a processing chamber 102 and a gas source 140 which includes a vapor-phase precursor source 141. Here, the processing chamber 102 is chemical vapor deposition (CVD) chamber, specifically a plasma enhanced CVD chamber. In other embodiments, the processing chamber is any processing chamber configured to process a substrate using vapor-phase precursors by exposing a surface of a substrate thereto, or any processing chamber where remote monitoring of components external to a processing volume thereof is desired. For example, in some embodiments the systems and methods described herein are adapted for use with a thermal CVD chamber, an atomic layer deposition (ALD) chamber including a plasma enhanced ALD chamber, an etch chamber, such as a plasma enhanced etch chamber, a thermal processing chamber, an implant chamber, or combinations thereof.

Here, the processing chamber 102 features a lid assembly 103, one or more sidewalls 104, and a chamber bottom 105 which collectively define a processing volume 106. A gas distributer 107 commonly referred to as a showerhead, having a plurality of openings 108 disposed therethrough, is disposed in the lid assembly 103 and is used to uniformly distribute processing gases, including vapor-phase precursors, from a gas inlet 109 into the processing volume 106. The gas distributer 107 is coupled to a power supply 110, such as an RF or VHF power supply, which supplies the power to ignite and maintain a processing plasma, here the plasma 111, composed of the processing gases through capacitive energy coupling therewith. The processing volume 106 is fluidly coupled to a chamber exhaust 117 through a vacuum outlet 112, such as to one or more dedicated vacuum pumps, e.g., a turbo pump, a rough pump, or a combination thereof. The chamber exhaust 117 maintains the processing volume 106 at sub-atmospheric conditions and evacuates processing and other gases therefrom.

In some embodiments, an exhaust conduit 161 fluidly coupling the processing volume 106 to the chamber exhaust 117 is heated to prevent condensation of unreacted vapor-phase precursors or deposition of the precursor in the exhaust conduit 161 at a location proximate to the processing volume 106. A substrate support assembly 113, disposed in the processing volume 106 is disposed on a support shaft 114 sealingly extending through the chamber bottom 105. A first bellows 115 circumscribes the support shaft 114 and is coupled to the chamber bottom 105 and a first actuator 116 to provide a flexible seal therebetween and to maintain the vacuum integrity of the processing volume 106. The support shaft 114 is coupled to the first actuator 116 which is configured to raise and lower the support shaft 114, and thus the substrate support assembly 113 disposed thereon, to facilitate processing of a substrate 119 and transfer thereof to and from the processing chamber 102.

The substrate 119 is loaded into, and removed from, the processing volume 106 through an opening 120 in one of the one or more sidewalls 104, which is conventionally sealed with a door or a valve (not shown) during substrate processing. A plurality of lift pins 121 disposed above, but engageable with, a lift pin hoop 122 are movably disposed through the substrate support assembly 113 to facilitate transferring of the substrate 119 to and from a substrate receiving surface thereof. The lift pin hoop 122 is coupled to a lift hoop shaft 123 extending through the chamber bottom 105, which raises and lowers the lift pin hoop 122 using a second actuator 124 coupled to the lift hoop shaft 123. A second bellows 125 circumscribes the lift hoop shaft 123 and is coupled to the chamber bottom 105 and the second actuator 124 to provide a flexible seal therebetween and to maintain the vacuum integrity of the processing volume 106. When the lift pin hoop 122 is in a raised position, the plurality of lift pins 121 are contacted from below and moved to extend above a substrate receiving surface of the substrate support assembly 113 lifting the substrate 119 therefrom and enabling access to the substrate 119 by a robot handler (not shown). When the lift pin hoop 122 is in a lowered position the tops of the plurality of lift pins 121 are flush with, or below, the receiving surface of the substrate support assembly and the substrate 119 rests thereon.

Typically, the substrate support assembly 113 includes a support base 126 and a substrate support 127 thermally coupled to, and disposed on, the support base 126. In some embodiments, the support base 126 is used to regulate the temperature of the substrate support 127, and the substrate 119 disposed on the substrate receiving surface of the substrate support 127, during processing. The support base 126 herein includes one or more cooling channels 128 disposed therein that are fluidly coupled to, and in fluid communication with, a coolant source 130 through one or more coolant lines 129. Typically, the coolant source 130 is a refrigerant source or water source having a relatively high electrical resistance.

Herein, the support base 126 is formed of a corrosion resistant thermally conductive material, such as a corrosion resistant metal, for example aluminum, an aluminum alloy, or stainless steel, and is thermally coupled to the substrate support 127 with an adhesive or by mechanical means. The substrate support 127 is typically formed of a dielectric material, such as a metal oxide or a metal nitride, for example aluminum oxide, and, in some embodiments, includes one or more heaters 131, such as one or more resistive heating elements, embedded therein. In some embodiments, the substrate support assembly 113 includes both the one or more heaters 131 and cooling channels 128 to enable fine temperature control of the temperature of the substrate support 127 and the substrate 119 disposed thereon. Typically, the substrate 119 is secured to the substrate support 127 by means of an electrostatic chucking (ESC) force. The chucking force is a function of a potential between a voltage provided to a chucking electrode (not shown) embedded in the dielectric material of the substrate support 127 and the substrate 119 disposed thereon. In some embodiments, the substrate support assembly 113 further includes one or more bias electrodes (not shown) embedded in the dielectric material of the substrate support 127, where the one or more bias electrodes are coupled to one or more bias power supplies (not shown).

The processing system 100 further includes a gas source 140 which includes one or more vapor-phase precursor sources 141 disposed in, or coupled to, a gas supply cabinet 142. The vapor-phase precursor source 141 vaporizes a liquid precursor, provided from a liquid-phase precursor ampoule 143 in fluid communication therewith, using a thermal and, or, vacuum enhanced vaporization process. In other embodiments, the vapor-phase precursor source 141 is a liquid injection vaporizer configured to provide a mixture of the vapor-phase precursor and a carrier gas to the processing volume 106 of the processing chamber 102. In some embodiments, the vapor-phase precursor source 141 is configured to vaporize or sublimate a solid precursor.

During substrate processing operations, one or more vapor-phase precursors flow into the processing volume 106 through a delivery conduit 144 in fluid communication therewith. Typically, the delivery conduit 144 is disposed in a heater jacket 146, configured to supply heat energy to maintain the delivery conduit 144 at a desired temperature, along the length thereof. In some embodiments, the heater jacket 146 is formed of a flexible polymer material and includes one or more resistive heating elements (not shown) where the one or more resistive heating elements is disposed proximate to, disposed on, and, or, in intimate contact with the delivery conduit 144. In other embodiments, the delivery conduit 144 is maintained at a desired temperature using a heater tape (not shown) wrapped around the conduit along the length, or along portions of the length, thereof.

The gas source 140 herein may be located remote from the processing chamber 102, such as in a sub-fab (typically a building floor beneath the floor where the processing chamber 102 is located, i.e., below a cleanroom area where the processing chamber 102 is located) or may be located proximate to and, or, adjacent to the processing chamber.

The processing system 100 further includes a system controller 132. The system controller 132 herein includes a central processing unit, here the CPU 133, a memory 134, and support circuits 135. The system controller 132 is used to control the process sequence, regulate the gas flows, including vapor-phase precursors, from the gas source 140 into the processing volume 106, heat/cool and, or, maintain the substrate support 127 and/or the substrate 119, disposed on a substrate receiving surface thereof, ignite and maintain the plasma 111 by controlling the power provided to the lid assembly 103 by the power supply 110, and control substrate handling operations including raising and lowering of the support shaft 114 and, or, the lift hoop shaft 123 by the first and second actuators 116 and 124 respectively. The CPU 133 is a general purpose computer processor configured for use in an industrial setting for controlling processing chamber and sub-processors related thereto. The memory 134 herein includes random access memory, read only memory, floppy or hard disk drive, or other suitable forms of digital storage, local or remote. The support circuits 135 are conventionally coupled to the CPU 133 and comprise cache, clock circuits, input/output subsystems, power supplies, and the like, and combinations thereof. In some embodiments, the system controller 132 further includes one or more computer readable media (not shown).

Computer readable media herein includes any device, located either locally or remotely from the system controller 132, which is capable of storing information that is retrievable by a computing device. Examples of computer readable media useable with embodiments of the present disclosure include solid state memory, floppy disks, internal or external hard drives, and optical memory (CDs, DVDs, BR-D, etc). In one embodiment, the computer readable media comprises the memory 134. Further, any connection is properly termed a computer-readable medium. For example, when instructions are transmitted from a website, server, or other remote source using a coaxial cable, fiber optic cable, twisted pair, digital subscriber line (DSL), or wireless technologies such as infrared (IR), radio, and microwave, then the coaxial cable, fiber optic cable, twisted pair, DSL, or wireless technologies such as infrared, radio, and microwave are included in the definition of medium. Software routines, when executed by the CPU 133, transform the CPU into a specific purpose computer, herein the system controller 132, that controls the operation of the processing system 100, such that the processes are performed in accordance with embodiments of the disclosure. In some embodiments, the software routines are stored and/or executed by a second controller (not shown) that is located remotely from the processing system 100. In other embodiments, the processes described herein, or portions thereof, are performed by one or more application specific integrated circuits (ASIC) or other types of hardware implementations. In some other embodiments, the processes described herein are performed by a combination of software routines, ASIC(s), and/or other types of hardware implementations.

The remote monitoring system 150 includes a plurality of first sensors 145, a data acquisition (DAQ) device 152, a plurality of communication links 151 communicatively coupling the plurality of first sensors 145 to the DAQ device 152, and a remote monitor 155 communicatively coupled to the DAQ device 152 through a communication link 156. The plurality of first sensors 145, herein a plurality of temperatures sensors, such as a plurality of thermocouples, are disposed in the heater jacket 146 proximate to, adjacent to, and, or, in intimate contact with the delivery conduit 144 at a respective plurality of locations along the length thereof. Each of the plurality of first sensors 145 measures a temperature of a surface of the delivery conduit 144 and, or, a temperature proximate to a surface of the delivery conduit 144 at respective locations along the length thereof.

In some embodiments, one or more of the plurality of first sensors 145 are positioned at locations where non-uniform temperature excursions may be considered more likely to occur, such as in location where the delivery conduit passes through an opening formed in a sheet metal wall, such as an opening formed in the gas supply cabinet 142, or an opening formed in a floor between a sub-fab and a cleanroom, or at locations of bends in the delivery conduit 144, or at locations where the delivery conduit 144 and, or, the heater jacket 146 are likely to be inadvertently contacted, such as in high foot traffic areas, or at locations where one or more segments of the heater jacket 146 are joined. In some embodiments, the plurality of first sensors 145 are spaced apart at regular intervals along the length, or along portions of the length, of the delivery conduit 144.

In further or other embodiments, the remote monitoring system 150 includes one or more second sensors 185, herein one or more temperature sensors, such as one or more thermocouples. Here, the one or more second sensors 185 are disposed on, located proximate to, located adjacent to, or in intimate contact with surfaces of components of the processing system 100. For example, in some embodiments, one or more second sensors 185 are disposed on an exhaust conduit 161 fluidly coupling the processing volume 106 to the chamber exhaust 117. In some embodiments, one or more second sensors 185 are disposed on, in, and, or, proximate to the gas supply cabinet 142 and, or, on the liquid-phase precursor ampoule 143 enabling monitoring of the gas supply cabinet environment and, or, the precursor ampoule respectively. In some embodiments, one or more second sensors 185 are disposed on surfaces of the processing chamber 102 external to the processing volume 106, such as on and, or, proximate to the door or valve (not shown) used to seal the opening 120 to the processing volume 106. In some embodiments, one or more second sensors 185 are disposed on the support shaft 114 of the substrate support assembly 113 in a location external to the processing volume 106 or on the lift hoop shaft 123 in a location external to the processing volume 106, and, or on the respective actuators 116, 124 coupled thereto.

In other embodiments, the remote monitoring system 150 provides a flexible configuration where one or more second sensors 185 can be positioned at one or more desired locations on and, or, proximate to the processing system 100 for purposes of troubleshooting processing and, or, equipment performance issues related thereto. Embodiments where the remote monitoring system 150 includes one or more second sensors 185 disposed in locations external to a processing volume of a processing chamber are suitable for use with any substrate processing system where remote monitoring of processing system temperatures is desired, including use with CVD chambers, ALD chambers, etch chambers, physical vapor deposition (PVD) chambers, implant chambers, and, or, thermal processing chambers.

Each of the sensors 145, 185 convert a respective measured temperature to an electrical signal, herein a voltage, that is communicated to the DAQ device 152 through a respective communication link 151. Herein, the communication links 151 are wired connections. In other embodiments, the communication links 151 include a wireless communication protocol where each of the sensors 145, 185 are communicatively coupled to a remote communication device, such as a radio frequency (RF) device, which sends information received from the sensors 145, 185 to one or more interrogators in communication with the DAQ device 152. Herein, the DAQ device 152 includes suitable circuitry and a multi-channel analog-to-digital (A/D) convertor for converting a plurality of analog voltage signals received from the sensors 145, 185 into digitized information which is then sent to the remote monitor 155 through the communication link 156. In some embodiments, the DAQ device 152 is further communicatively coupled to the system controller 132 using a communication link 158 which allows the system controller 132 to receive digitized information therefrom or communicate information thereto. Typically, the communication links 156, 158 comprise wired connections (e.g., Ethernet). In other embodiments, one or both of the communication links 156, 158 comprise a wireless communication protocol.

The remote monitor 155 includes a central processing unit (CPU) 173, a memory 174, and support circuits 175. The remote monitor 155 is used to convert the digitized information received from the DAQ device 152 into temperature data for each of the sensors 145, 185, monitor the temperature data for undesirable temperature excursions in real time, generate historical data for storage, perform statistical analysis of the historical data, and, or flag temperature excursions, i.e., temperature changes beyond an acceptable range, to a user. The CPU 173 is a general purpose computer processor configured for use in an industrial setting for collecting and monitoring data received from one or more sensors through the DAQ device 152. The memory 174 herein includes random access memory, read only memory, floppy or hard disk drive, or other suitable forms of digital storage, local or remote. The support circuits 175 are conventionally coupled to the CPU 133 and comprise cache, clock circuits, input/output subsystems, power supplies, and the like, and combinations thereof. In some embodiments, the remote monitor 155 further includes one or more computer readable media (not shown), such as the computer readable media described in relation to the system controller 132. Software routines, when executed by the CPU 173, transform the CPU into a specific purpose computer, herein the remote monitor 155. Typically, the remote monitor 155 is also communicatively coupled to the system controller 132 through a wired communication link 157, e.g., an Ethernet cable. In other embodiments, the wired communication link 157 comprises a wireless communication protocol.

Herein, the system controller 132 provides context information, such as substrate processing information and, or, maintenance operation information, to the remote monitor 155 through the communication link 157. Context information herein relates to instructions executed by the system controller 132 to the control the operation of the processing system 100. In some embodiments, context information further includes conditions of the processing system 100, such as substrate processing conditions, communicated to the system controller 132 by processing condition sensors disposed in, on, proximate to, or adjacent to the processing system, for example pressure sensors, temperature sensors, and, or, flowrate sensors (including flowmeters). Typically, system controllers configured for use with substrate processing systems in semiconductor device manufacturing, such as the system controller 132, have at least two modes for controlling the operation of the processing system 100. The first mode, a processing mode, controls substrate processing and processing system operations related thereto. The second mode, a maintenance mode, allows a user, typically a maintenance technician or engineer, to conduct maintenance procedures on the processing system, for example venting the processing volume of the processing chamber to atmosphere to enable the user to open the processing chamber and have access thereinto.

Context information related to substrate processing when the processing system 100 is in a processing mode includes the beginning of a substrate processing sequence, the end of a substrate processing sequence, and, or, the beginning and, or, end of substrate processing sequence activities therebetween. Examples of process sequence activates include the beginning and end of pumping down the processing volume 106 to a desired processing pressure, flowing processing gases into the processing volume 106, igniting the plasma 111, and, or, chucking the substrate 119 to the substrate support 127. In some embodiments, the context information further includes processing chamber conditions before, during, and, or, after substrate processing therein, for example, the pressure in the processing volume 106, the temperature of the substrate support 127, and, sometimes, the temperature of the substrate 119.

In some embodiments, the context information further includes a process recipe (instructions provided by the system controller 132 with respect to processing conditions for a particular substrate or type of substrate) corresponding to the process sequence. Context information related to equipment maintenance typically includes the beginning of maintenance mode (instructions to the system controller 132 allowing access by a user to maintenance functions executed by the system controller 132), the end of maintenance mode, and, or, the beginning and, or, end of maintenance activities therebetween performed using the system controller 132, for example venting the processing volume 106 to atmosphere to enable access thereinto or pumping down the processing volume 106 to a desired vacuum condition after closure thereof. In some embodiments, the context information further includes processing chamber conditions such as pressure and temperature during maintenance operations thereon. Herein, context information is received by the remote monitor 155 contemporaneously with the context event (e.g., the beginning of a substrate processing sequence) and in parallel with digitized sensor information received from the DAQ device 152.

In one embodiment, the remote monitor 155 uses context information and digitized sensor information (received in parallel) to generate historical data for storage and retrieval, and, or, contemporaneous statistical data analysis. Herein, historical data indicates a subset of the digitized information provided to the remote monitor 155 from the DAQ device 152 which is suitable for storage and retrieval and, or, use with conventional statistical process control methods. For example, in one embodiment, historical data generated by the remote monitor includes individual temperatures, herein $T_n$, measured by each of the plurality of first sensors 145 at locations along the delivery conduit 144, corresponding context information, and the respective day(s) and time(s) corresponding thereto. In another embodiment, the historical data includes an average of the temperatures, herein $T_{avg}$, measured by the plurality of first sensors 145 at locations along the delivery conduit 144, corresponding context information, and the respective day(s) and time(s) corresponding thereto.

In another embodiment, the historical data includes a difference in the temperatures measured by the plurality of first sensors 145 disposed at locations along the delivery conduit 144, such as the difference between the maximum measured temperature and the minimum measured temperature, herein $\Delta T$, and, or, the standard deviation of the measured temperatures, herein $T_{stdev}$, corresponding context information, and the day(s) and time(s) corresponding thereto. In other embodiments, the historical data includes individual temperatures measured by one or more of the second sensors 185, corresponding context information, and the respective day(s) and time(s) corresponding thereto.

In some embodiments, the remote monitor 155 is configured to monitor historical data using conventional statistical process control methods. For example, in some embodiments, the historical data is plotted on a graph with pre-determined control limits and, or, otherwise compared to one or more pre-determined control limits and flagged if a data point (e.g., one or more temperature measurements, or one or more values calculated using a plurality of temperature measurements), for a specified context event (e.g., the beginning of a substrate processing sequence) falls above and, or, below the one or more pre-determined control limits. In some embodiments, the remote monitor is configured to alert a user to an out-of-control event (when one or more data points falls outside of the one or more pre-determined control limits). Typically, once alerted, the user will initiate a pre-determined action plan to troubleshoot the out-of-control event, also known as out-of-control action plan (OCAP), typically a flowchart that guides the users response to the out-of-control event.

Herein, alerting a user to an out-of-control event includes any form of alert designed to communicate the out-of-control event to a desired user, including visual and audio alarms and, or, electronic messaging, e.g., automatically generated email and, or, automatically generated text messages. In some embodiments, the remote monitor 155 is configured to communicate the out-of-control event to the system controller 132 and the system controller 132 is configured to sound an alarm and, or, suspend substrate processing operations. In some embodiments, the remote monitor 155 is configured to communicate historical data, and, or, out-of-control events to a fab-level control system 160 communicatively coupled thereto.

In some embodiments, the remote monitor 155 is configured to contemporaneously monitor the digitized information received from the DAQ device 152 and to trigger an alarm event if the digitized information falls outside of predetermined control limits. In some of those embodiments, the remote monitor 155 is configured to generate and store historical data related to the alarm event.

Figure 2A:
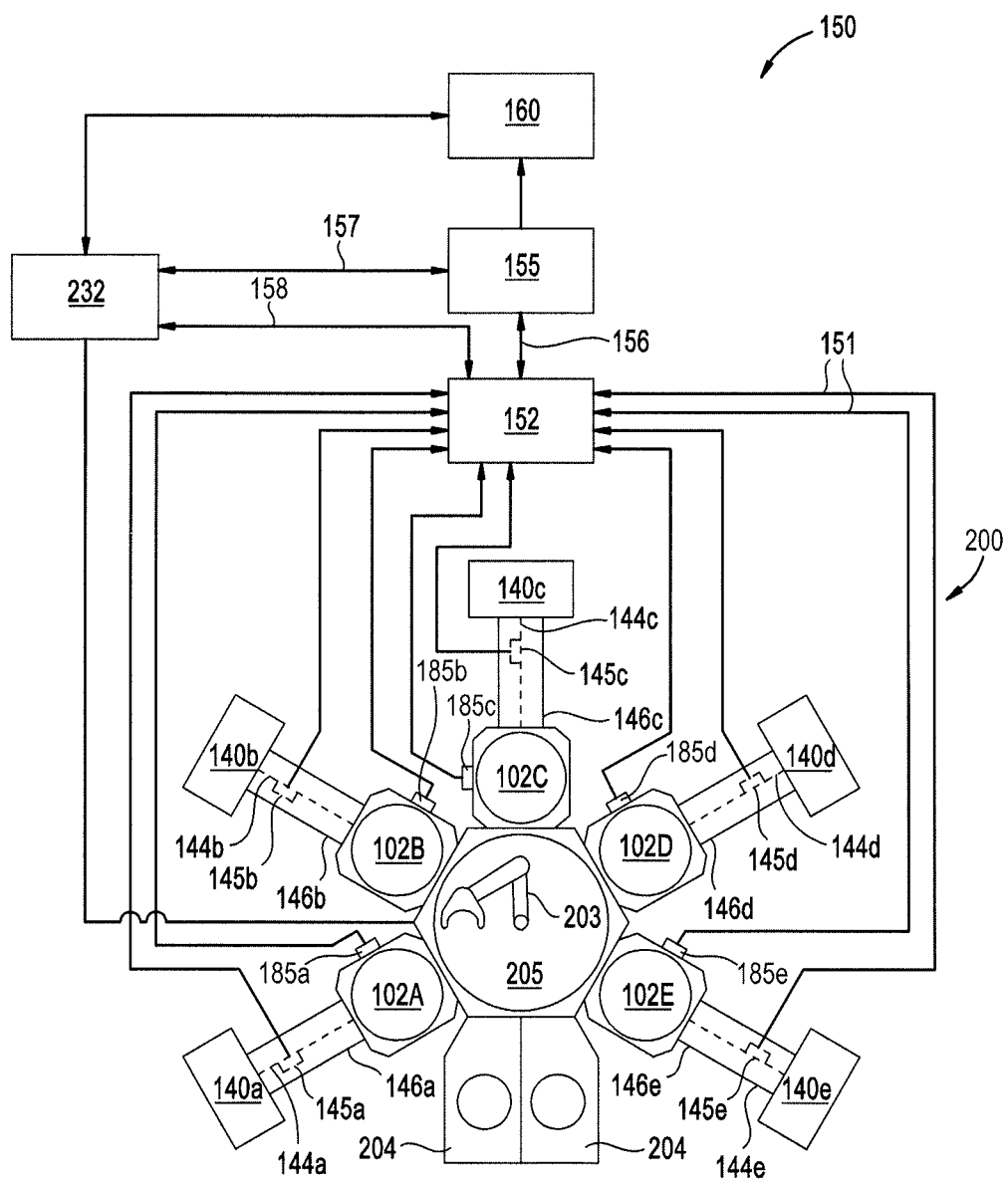
FIG. 2A is a schematic plan view of a multi-chamber processing system, adapted to benefit from the embodiments described herein.

FIG. 2A is a schematic top view of a multi-chamber processing system, adapted to benefit from the embodiments described herein, according to one embodiment. Herein, the multi-chamber processing system 200A includes a plurality of processing systems, such as the single chamber processing system 100 described in FIG. 1, each comprising a processing chamber 102A-E fluidly coupled to a respective gas source 140*a-e* through a respective delivery conduit 144*a-e*, one or more load lock chambers 204, and a transfer chamber 205 (shown with the top removed) having a robot handler 203 disposed therein. Herein, the gas sources 140*a-e* include one or more vapor-phase precursor sources, such as the vapor-phase precursor source 141 described in FIG. 1. The multi-chamber processing system 200A is coupled to a system controller 232 which may be the same or comprise the same or similar components to the components of the system controller 132 described above in FIG. 1. The system controller 232 is used to control the operation of the load lock chambers 204, the transfer chamber 205 and the robot handler 203 disposed therein, and the individual operation of each of the plurality of processing systems respectively comprising the processing chambers 102A-E and the respective gas sources 140*a-e* fluidly coupled thereto. In some embodiments, the multi-chamber processing system 200A includes a plurality of sub-controllers (not shown) where each of the plurality of sub-controllers is communicatively coupled to the system controller 232, and each of the plurality of sub-controllers is configured to control the operation of one or more of the processing systems 100*a-e*, such as the system controller 132 described in FIG. 1. In some embodiments, the system controller 232 is communicatively coupled to the DAQ device 152 using a communication link 158.

Herein, each of the plurality of delivery conduits 144*a-e* is disposed in a respective heater jacket 146*a-e*. Each of the delivery conduits 144*a-e* has a respective plurality of first sensors 145*a-e* disposed on, disposed proximate to, and, or, in intimate contact with the delivery conduit 144*a-e*, at a respective plurality of locations along the length thereof. Each of the sensors of a plurality of first sensors 145*a-e* are communicatively coupled to the DAQ device 152 through a plurality of respective communication links 151. The DAQ device 152 is communicatively coupled to the remote monitor 155 through the communication link 156. In some embodiments, the remote monitor 155 is communicatively coupled to a plurality of DAQ devices 152 where each of the plurality of DAQ devices is configured to receive and digitize sensor information from a respective plurality of first sensors 145*a-e* corresponding to one or more of the delivery conduits 144*a-e*.

In some embodiments, which may be combined with other embodiments described herein, the remote monitoring system 150 for the multi-chamber processing system 200A includes one or more second sensors 185*a-e*, such as the second sensors 185 described in FIG. 1. Here, the one or more second sensors 185*a-e* are disposed on, located proximate to, located adjacent to, and, or, in intimate contact with surfaces of the processing system 200A that are external to processing volumes of the plurality of processing chambers 102A-E, such as the locations described in FIG. 1. In some embodiments, one or more second sensors 185 are disposed on, located proximate to, located adjacent to, and, or, in intimate contact with surfaces of the load lock chambers 204, the transfer chamber 205 and the robot handler 203 disposed therein, and, or, components thereof or related thereto, such as a motor coupled to the robot handler 203. For example, in some embodiments one or more second sensors, such as the second sensors 185 described in FIG. 1, are disposed on, in, proximate to, adjacent to, or intimate contact with doors or valves disposed between load lock chambers 204 and the transfer chamber 205 or doors or valves disposed between the transfer chamber 205 and processing chambers 102 A-E. In those embodiments, the one or more second sensors 185 are communicatively coupled to the DAQ device 152 through one or more respective communication links, such as communication links 151. In some other embodiments, the remote monitoring system 150 includes a plurality of DAQ devices where each DAQ device 152 receives information from first sensors 145 and second sensors corresponding to one or more of the plurality of processing systems 100*a-e*.

FIG. 2B illustrates the remote monitoring system described in FIG. 1, adapted for use with a plurality of multi-chamber processing systems 200A-E, according to one embodiment. Typically, the remote monitor 155 receives digitized information from one or more DAQ devices 152A-B, each DAQ device 152A-B corresponding to a multi-chamber processing system where each of the one or more DAQ devices A-B is communicatively coupled to one or more pluralities of first sensors 145*a-e* and one or more second sensors (not shown) through respective communication links 151.

Figure 3:
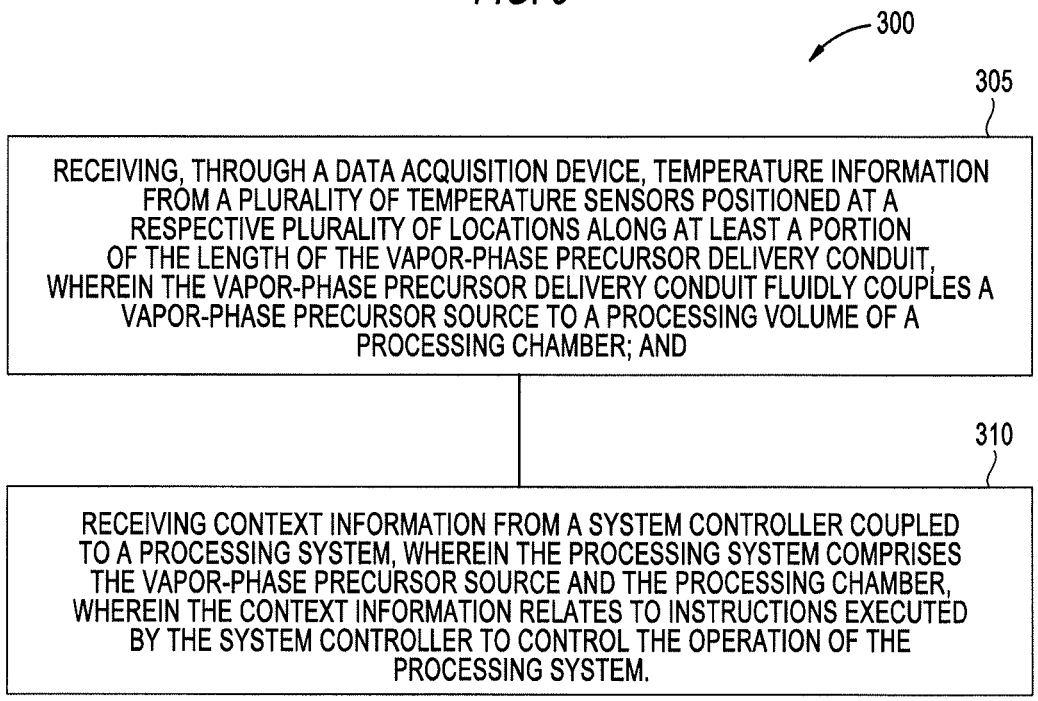
FIG. 3 is a flow diagram setting forth a method of monitoring a vapor-phase precursor delivery conduit, according to one embodiment.

FIG. 3 is a flow diagram setting forth method of monitoring a vapor-phase precursor delivery conduit, according to one embodiment. At activity 305 the method 300 includes receiving, through a data acquisition device, temperature information from a plurality of temperature sensors positioned at a respective plurality of locations along at least a portion of the length of the vapor-phase precursor delivery conduit. Herein, the vapor-phase precursor delivery conduit fluidly couples a vapor-phase precursor source to a processing volume of a processing chamber. At activity 310 the method 300 includes receiving context information from a system controller coupled to a processing system, where the processing system includes the vapor-phase precursor source and the processing chamber. Herein, the context information relates to instructions executed by the system controller to control the operation of the processing system.

In some embodiments of the method 300, one or more of the plurality of temperature sensors are disposed on, disposed adjacent to, disposed proximate to, or are in intimate contact with the vapor-phase precursor delivery conduit. In some embodiments of the method 300, the plurality of temperature sensors includes one or more thermocouples. In some embodiments of the method 300, the vapor-phase precursor delivery conduit is disposed in a heater jacket along at least portions of the length thereof. In some embodiments of the method 300, the heater jacket, using one or more heating elements disposed therein, is configured to maintain the vapor-phase precursor delivery conduit at a desired temperature.

In some embodiments, the method 300 further includes monitoring the temperature of the vapor-phase precursor delivery conduit using a remote monitor, where the remote monitor is communicatively coupled to the data acquisition device, and wherein the remote monitor is communicatively coupled to the system controller. In some embodiments, the method 300 further includes, generating historical data comprising temperature information, context information, and day and time information. In some embodiments, the method 300 further includes storing the historical data in a memory of the remote monitor. In some embodiments the method 300 further includes comparing the historical data to one or more pre-determined control limits. In some embodiments, the method 300 further includes communicating an out-of-control event to a user, where the out-of-control event comprises one or more historical data points above or below one or more pre-determined control limits. In some embodiments of the method 300, the processing chamber is a CVD chamber, an ALD chamber, or an etch chamber. In some embodiments of the method 300, the context information comprises substrate processing information, maintenance operation information, or a combination thereof. Although the method 300 is described above with respect to a single chamber processing system, such as the single chamber processing system 100 of FIG. 1, it is contemplated that the method 300 may be applied to one or more of, or combinations of, the multi-chamber processing systems 200A-B described in FIGS. 2A-2B.

The method 300 enables a user of a remote monitoring system, such as the remote monitoring system 150 described in FIGS. 1 and 2A-2B, to contemporaneously view temperature measurements of, or proximate to, a vapor-phase precursor delivery conduit, at a plurality of locations along the length, or a portion of the length, thereof. Further, in some embodiments, the remote monitor is configured, using sensor identification information, to display the approximate respective locations of each temperature measurement which is beneficial for troubleshooting and or standard maintenance procedure purposes. For example, in troubleshooting a temperature excursion a user can determine and approximate location of the excursion using corresponding sensor identification information displayed by the remote monitor. In another example, a maintenance procedure may require a user, using the remote monitoring system, to ensure that the temperature of the vapor-phase delivery conduit is at a uniform desired temperature along the length thereof before the user returns the system controller to a substrate processing mode. By ensuring the temperature of the vapor-phase delivery conduit is at a uniform desired temperature before flowing a vapor-phase thereinto, undesirable condensation in the vapor-phase delivery conduit can be avoided along with particle contamination issues associated therewith.

The method 300 further enables process development and improvement, and improved statistical process control, based on statistical analysis of historical information for one or more context events. For example, statistical analysis of historical information may reveal that some temperature excursions correlate to a specific process sequence or an sequence activity and a change in the sequence or sequence activity might substantially reduce, and, or eliminate the temperature excursion and, therefore, reduce or eliminate particles contamination issues associated therewith.

FIG. 4 is a flow diagram setting forth a method of monitoring a processing system, according to one embodiment. At activity 405 the method 400 includes receiving, through a data acquisition device, temperature information from one or more temperature sensors, where the one or more temperature sensors are disposed in locations external to a processing volume of a processing chamber. At activity 410 the method 400 includes receiving context information from a system controller coupled to the processing chamber, where the context information relates to instructions executed by the system controller to control the operation of the processing system. In some embodiments, the method 400 further includes generating historical data comprising temperature information, context information, and day and time information. In some embodiments, the method 400 further includes storing the historical data in a memory of the remote monitor. Although the method 400 is described above with respect to a single chamber processing system, such as the single chamber processing system 100 of FIG. 1, it is contemplated that the method 400 may be applied to one or more of, or combinations of, the multi-chamber processing systems 200A-B described in FIGS. 2A-2B.

The method 400 enables a user of a remote monitoring system, such as the remote monitoring system 150 described in FIGS. 1 and 2A-2B, to contemporaneously view temperature measurements of, or proximate to, desired components of a processing system. Further, in some embodiments, the remote monitoring system is configured, using sensor identification information, to display the approximate respective locations of each temperature measurement which is beneficial for troubleshooting and, or, standard maintenance procedure purposes.

The method 400 further enables process development and improvement, and improved statistical process control, based on statistical analysis of historical information for one or more context events. Further, the method 400 enables informed equipment design improvement by providing historical information that can be correlated to equipment performance in a high volume manufacturing facility. For example, in processing systems where configured to process substrates at relatively high temperatures, e.g., more than 650° C., historical information may include temperature measurements of, and, or, proximate to, processing components in thermal communication with components disposed in the processing volume of a processing chamber, such as a substrate support, and components disposed proximate thereto. Statistical analysis of the historical information may be used to improve the design of the components including the thermal interactions therebetween and, therefore, improve processing system reliability. For example, statistical analysis of the historical information may reveal previously unknown undesirable thermal conditions (overheating) of components of the processing system and improvements thereto may include new and, or, improved cooling system designs, processing system configurations, and or material selection for processing components.

The embodiments described herein provide for the remote monitoring of processing system temperatures at a variety of locations external to a processing volume of a processing chamber. Remote monitoring, and collection and analysis of historical data related thereto, beneficially enables improved process control methods as well as provides data that can be used to ensure stable and repeatable processing system performance.

While the foregoing is directed to embodiments of the present disclosure, other and further embodiments of the disclosure may be devised without departing from the basic scope thereof, and the scope thereof is determined by the claims that follow.

The invention claimed is:

1. A method of monitoring liquid condensation in the liquid line delivery system of a processing system, comprising:
  maintaining a vapor-phase precursor delivery conduit at a desired uniform temperature with a heater jacket, the vapor-phase precursor delivery conduit fluidly coupling an outlet of a vapor phase precursor source to an inlet of a processing volume of the processing system;
  receiving, through a data acquisition device, temperature information from a plurality of temperature sensors coupled along an external surface of the vapor-phase precursor delivery conduit, wherein the plurality of temperature sensors are disposed in one or more locations external to the processing volume on the vapor-phase precursor delivery conduit of the processing system;

receiving, context information from a system controller coupled to a processing system comprising the processing chamber, wherein the context information relates to instructions executed by the system controller to control one or more operations of the processing system and historical temperature data including the difference in the temperatures measured by the plurality of temperature sensors disposed at locations along the vapor phase precursor conduit;

computing pre-determined control limits from the context information;

comparing the temperature information from the plurality of sensors to one or more pre-determined control limits for each respective sensor of the plurality of sensors;

in response to temperature information outside the pre-determined control limits, communicating an out of control event to the user for nonuniform temperature of the vapor phase precursor conduit; and changing a control signal to the processing system based on the out of control event.

2. The method of claim 1, wherein the heater jacket has one or more heating elements disposed therein.

3. The method of claim 1, further comprising:
monitoring the temperature information received from the plurality of temperature sensors using a remote monitor, wherein the remote monitor is communicatively coupled to the data acquisition device, and wherein the remote monitor is communicatively coupled to the system controller.

4. The method of claim 3, further comprising:
generating the historical data comprising temperature information, context information, and day and time information corresponding to the temperature information and the context information; and
storing the historical data in a memory of the remote monitor.

5. The method of claim 3, further comprising communicating an out-of-control event to a user, wherein the out-of-control event comprises one or more historical data points comprising a temperature measurement or a value calculated from one or more temperature measurements above or below one or more pre-determined control limits.

6. The method of claim 3, further comprising:
comparing the one or more temperature measurements of the vapor-phase delivery conduit to one or more pre-determined control limits; and
communicating an out-of-control event to a user, wherein the out of control event comprises a temperature measurement above or below the one or more pre-determined control limits.

7. A method of monitoring a vapor-phase precursor delivery conduit, comprising:
maintaining a vapor-phase precursor delivery conduit at a uniform desired temperature with a heater jacket;
receiving, through a data acquisition device, temperature information from a plurality of temperature sensors positioned in the heater jacket at a respective plurality of locations along an external surface to at least a portion of a of the vapor-phase precursor delivery conduit, wherein the vapor-phase precursor delivery conduit fluidly couples an outlet of a vapor-phase precursor source to an inlet of a processing volume of a processing chamber; and receiving, context information, from a system controller coupled to a processing system, wherein the processing system comprises the vapor-phase precursor source and the processing chamber, and wherein the context information relates to instructions executed by the system controller to control the operation of the processing system and historical temperature data including the difference in the temperatures measured by the plurality of temperature sensors disposed at locations along the vapor phase precursor conduit;

comparing the temperature information to one or more pre-determined control limits;

communicating an out-of-control event to a user, wherein the out-of-control event comprises a temperature measurement from one or more temperature measurements above or below one or more pre-determined control limits indicative of the vapor-phase precursor delivery conduit having a nonuniform temperature; and changing a control signal to the processing system based on the out of control event.

8. The method of claim 7, further comprising:
monitoring one or more temperatures of the vapor-phase delivery conduit using a remote monitor, wherein the remote monitor is communicatively coupled to the data acquisition device, and wherein the remote monitor is communicatively coupled to the system controller.

9. The method of claim 7, further comprising:
generating the historical data comprising the temperature information, the context information, and day and time information corresponding to the temperature information and the context information; and
storing the historical data in a memory of the remote monitor.

10. A temperature monitoring system, comprising:
a data acquisition device configured to receive information from one or more temperature sensors through one or more respective communication links;
a plurality of temperature sensors positioned in a heater jacket disposed at locations along an external surface of a vapor-phase precursor delivery conduit;
a remote monitor configured to be communicatively coupled to the data acquisition device and to a system controller of a processing system, wherein the processing system comprises the processing chamber, wherein the vapor-phase precursor delivery conduit fluidly couples an outlet of a vapor-phase precursor source to an inlet of the processing volume, and wherein the remote monitor is configured to maintain temperature uniformity of the vapor-phase delivery conduit along at least the portion of the length thereof; and
a non-transitory computer readable medium having instructions stored thereon for performing a method when executed by a processor, the method comprising:
receiving, through the data acquisition device, temperature information from the one or more temperature sensors;
receiving, context information from a system controller coupled to the processing system, wherein the context information relates to instructions executed by the system controller to control one or more operations of the processing system
monitoring one or more temperatures measured at locations external to the processing volume of the processing chamber using the remote monitor;

comparing the temperature measurements to one or more pre-determined control limits;

communicating an out-of-control event to a user, wherein the out of control event comprises a temperature measurement above or below the one or more pre-determined control limits; and changing a control signal to the processing system based on the out of control event.

11. The temperature monitoring system of claim 10, further comprising:

a non-transitory computer readable medium having instructions stored thereon for performing a method when executed by a processor, the method comprising:

receiving, through the data acquisition device, temperature information from one or more temperature sensors respectively positioned at one or more locations along at least a portion of a length of the vapor-phase precursor delivery conduit;

receiving, context information from a system controller coupled to the processing system, wherein the processing system further comprises the vapor-phase precursor, and wherein the context information relates to instructions executed by the system controller to control one or more operations of the processing system;

monitoring one or more temperatures measured at locations along the vapor-phase delivery conduit;

comparing the temperature measurements to one or more pre-determined control limits; and communicating an out-of-control event to a user, wherein the out of control event comprises a temperature measurement above or below the one or more pre-determined control limits.

* * * * *